(12) United States Patent
Natarajan

(10) Patent No.: US 6,955,737 B2
(45) Date of Patent: Oct. 18, 2005

(54) SUPPORTED GREENSHEET STRUCTURE AND METHOD IN MLC PROCESSING

(75) Inventor: Govindarajan Natarajan, Pleasant Valley, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/604,191

(22) Filed: Jun. 30, 2003

(65) Prior Publication Data

US 2004/0265537 A1 Dec. 30, 2004

(51) Int. Cl.[7] .............................. B32B 31/18; B26F 1/00
(52) U.S. Cl. .................... 156/252; 156/89.12; 156/247; 156/253; 156/256; 83/30
(58) Field of Search .................... 156/256, 89.11, 156/89.12, 247, 248, 249, 252, 253, 277, 278, 289; 83/13, 30

(56) References Cited

U.S. PATENT DOCUMENTS

| | | | | |
|---|---|---|---|---|
| 4,802,945 A | * | 2/1989 | Opina ......................... | 156/247 |
| 4,990,080 A | * | 2/1991 | Kakimoto .................... | 425/290 |
| 5,271,150 A | * | 12/1993 | Inasaka ........................ | 29/852 |
| 5,274,916 A | * | 1/1994 | Kawabata et al. ............ | 29/848 |
| 5,466,330 A | * | 11/1995 | Sakai et al. .................. | 156/584 |
| 5,759,331 A | * | 6/1998 | Wallace ....................... | 156/248 |
| 5,792,293 A | * | 8/1998 | Inasaka ....................... | 156/89.16 |
| 5,876,549 A | | 3/1999 | Natarajan et al. | |
| 6,045,714 A | * | 4/2000 | Humenik et al. ............. | 216/17 |
| 6,413,340 B1 | * | 7/2002 | Anbo et al. ................. | 156/89.12 |
| 6,607,620 B2 | * | 8/2003 | Knickerbocker et al. | 156/89.16 |
| 6,607,780 B1 | * | 8/2003 | Natarajan et al. ........ | 156/89.12 |

FOREIGN PATENT DOCUMENTS

| | | | |
|---|---|---|---|
| JP | 59-56747 | * | 4/1984 |
| JP | 62-157799 | * | 7/1987 |
| JP | 1-202405 | * | 8/1989 |
| JP | 2-136204 | * | 5/1990 |
| JP | 2-310996 | * | 12/1990 |
| JP | 3-69188 | * | 3/1991 |
| JP | 3-116895 | * | 5/1991 |
| JP | 3251397 A | | 11/1991 |
| JP | 3270761 A | | 12/1991 |
| JP | 4-15991 | * | 1/1992 |
| JP | 4022850 A | | 1/1992 |
| JP | 4-102396 | * | 4/1992 |
| JP | 4-164606 | * | 6/1992 |
| JP | 4199697 A | | 7/1992 |
| JP | 4-346292 | * | 12/1992 |
| JP | 4-368817 | * | 12/1992 |
| JP | 5198947 A | | 8/1993 |
| JP | 5220726 A | | 8/1993 |
| JP | 5228450 A | | 9/1993 |
| JP | 5301212 A | | 11/1993 |
| JP | 6021717 A | | 1/1994 |
| JP | 6216530 A | | 8/1994 |

(Continued)

*Primary Examiner*—Melvin Mayes
(74) *Attorney, Agent, or Firm*—DeLio & Peterson, LLC; Kelly M. Nowak; James J. Cioffi

(57) ABSTRACT

Methods for forming and the intermediate greensheet products formed are provided by attaching a removable support film to a first surface of a greensheet and a frame to a second surface of the greensheet. The support film is preferably a peelable support film cast to the first surface of the greensheet for providing strength thereto. A plurality of openings are formed in the greensheet by punching into the support film, through the support film and then through the greensheet. During this process, the support film provides added strength to the greensheet therein significantly reducing embossing and deformation of such greensheet. A second support film may be attached to the removable support film using an adhesive layer, which, is extruded into the openings upon attachment. The support film(s) may be peeled off the greensheet with little or no impact on via locations as a metal frame continues to support the greensheet.

22 Claims, 4 Drawing Sheets

FOREIGN PATENT DOCUMENTS

| | | | |
|---|---|---|---|
| JP | 6-252561 | * | 9/1994 |
| JP | 6-270123 | * | 9/1994 |
| JP | 6-275953 | * | 9/1994 |
| JP | 7-30252 | * | 1/1995 |
| JP | 7-307571 | * | 11/1995 |
| JP | 7308911 A | | 11/1995 |
| JP | 8168996 A | | 7/1996 |
| JP | 8309725 A | | 11/1996 |
| JP | 8316635 A | | 11/1996 |
| JP | 9036547 A | | 2/1997 |
| JP | 10065345 A | | 3/1998 |
| JP | 11192683 A | | 7/1999 |
| JP | 2001293716 A | | 10/2001 |

* cited by examiner

SUPPORTED GREENSHEET STRUCTURE AND METHOD IN MLC PROCESSING

BACKGROUND OF INVENTION

1. Field of the Invention

The present invention relates generally to processing of greensheets used to make ceramic substrates for microelectronic components.

2. Description of Related Art

In the ceramic electronics industry, multilayer ceramic (MLC) technology is typically used to create three-dimensional circuitry for microelectronic devices such as integrated circuits and ceramic capacitors. These three-dimensional circuitries are made by applying a conductive material in a circuit pattern on a ceramic/polymer composite sheet known as a greensheet.

A greensheet may have a number of via holes punched in it to allow vertical connection between the conductive material on adjacent sheets, whereby after the vias are punched in the sheets, the greensheet is screened and patterned by applying a conductive paste into the via holes and along the surface of the greensheet. A number of via punched greensheets are then stacked in a designated order and laminated together under appropriate heat and pressure to form a laminate which can be handled as a unified structure. The laminated ceramic/polymer composite is then heated to remove the polymer, and then heated to a higher temperature to sinter and densify the ceramic thereby forming the final MLC.

Over the years, future generations of MLC technology have developed to incorporate advanced technologies and groundrules, i.e., triple dense conductors, thin green sheets and large area greensheets. With these advanced technologies, as via diameters and the pitch associated therewith become smaller it is necessary to use thinner greensheets, and in particular, thinner sheets with large x-y dimensions. However, in the course of adopting such new technologies, greensheet stability has become a concern. In particular, the smaller vias and tighter grids pose radial error problems in punching and screening thinner greensheets, including deforming and embossing of the greensheet, and misalignment of the conductive vias and other features, thereby rendering the greensheet non-manufacturable.

As it is desirable that future via holes in thinner greensheets be punched and screened with a small radial error, a need continues to exist in the art for improved greensheets and methods of forming the same.

SUMMARY OF INVENTION

Bearing in mind the problems and deficiencies of the prior art, it is therefore an object of the present invention to provide an improved via-punched and screened greensheet for use with advanced groundrules, thin green sheets, thick green sheets and/or large area greensheets.

It is another object of the present invention to provide an improved greensheet and processing method which reduces deformation and embossing of thin or thick green sheets.

A further object of the invention is to provide an improved greensheet and processing method which reduces radial error of the screened greensheet.

It is yet another object of the present invention to provide a process and system to make greensheet via alignment more precise in stacked greensheet laminates.

Another object of the invention is to provide a processing method of forming a greensheet which utilizes conventional toolset and processes with little or no impact on cost.

Still other objects and advantages of the invention will in part be obvious and will in part be apparent from the specification.

The above and other objects and advantages, which will be apparent to one of skill in the art, are achieved in the present invention, which, is directed to in a first aspect a method of forming openings in a substrate. The method includes providing a substrate with first and second surfaces, and attaching a removable support film to the first surface. At least one opening is formed in the substrate by entering the removable support film on the first surface, traversing through the substrate and exiting the substrate at the second surface. The opening may be a via, line, deep hole or channel. During this process, the removable support film prevents damage to the substrate by constraining movement of the substrate during formation of the at least one opening. The method may further include attaching a frame to the second surface of the substrate, wherein after removal of the support film, the frame constrains movement of the substrate during subsequent processing steps.

Preferably, the removable support film comprises a peelable support film, which, is removed by peeling the support film in a direction substantially parallel to the substrate. The substrate may be a greensheet, mask layer, metal layer, organic layer, inorganic layer or composites thereof.

In another aspect, the invention provides a method of processing greensheets for use as microelectronic substrates. The method includes providing a greensheet having a first and second surface, and attaching a first support film to the first surface. The first support film and greensheet are then sequentially processed whereby the first support film constrains movement of the greensheet to prevent damage thereto such greensheet. This support film is preferably cast to the greensheet, has a thickness ranging from about 0.5 mils to about 6 mils and comprises a material that has sufficient rigidity to prevent damage to the greensheet during such processing steps.

In this aspect of the invention, the step of sequentially processing the first support film and the greensheet comprises punching a plurality of openings in the first support film and the greensheet using a punching tool that enters the first support film, traverses therethrough, enters the greensheet at the first surface, traverses through the greensheet and exits the greensheet at the second surface. For ease of removal of the support film, the greensheet is provided with angled openings to form a weak joint for removing the first support film from the greensheet. The method may further include attaching a frame to the second surface, wherein after removal of the first support film, the frame constrains movement of the greensheet during subsequent processing steps.

In still another aspect of the invention, the invention provides a method of processing greensheets for use as microelectronic substrates. The method includes providing a greensheet having first and second surfaces, and attaching a peelable support film to the first surface. A plurality of openings are formed in the greensheet by sequentially entering the peelable support film on the first surface, traversing through the greensheet and exiting the greensheet at the second surface. In so doing, the peelable support film has substantial rigidity to prevent damage to the greensheet by constraining movement of the substrate during formation of the plurality of openings. These openings may include vias, lines, deep holes, channels and combinations thereof.

In this aspect, a frame may be attached to the second surface of the greensheet and/or a second peelable support film may be attached to the first peelable support film. In attaching the second peelable support film to the first peelable support film, the method includes forming the plurality of openings traversing through the first peelable support film and the greensheet, depositing an interface layer on the second peelable support film and adhering the first and second peelable support films to each other using the interface layer under sufficient pressure to extrude a portion of the interface layer into the openings. Subsequently, a metal paste may be screened over the second surface of the greensheet to fill the openings and form a plurality of conductive feature in the greensheet. The stacked layers of the first support film, interface layer and the second support film are then peeled off of the first surface of the greensheet in a direction that is substantially parallel with the first surface without damaging the greensheet or the deposited metallurgy.

Another aspect of the invention is directed to an intermediate greensheet product. This intermediate greensheet product comprises a greensheet, a support film attached to a first surface of the greensheet and a plurality of openings traversing through the support film and the greensheet wherein the support film constrains movement of the greensheet during formation of these openings to provide the greensheet with a planar, undamaged body.

BRIEF DESCRIPTION OF DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DETAILED DESCRIPTION

Figure 1A:
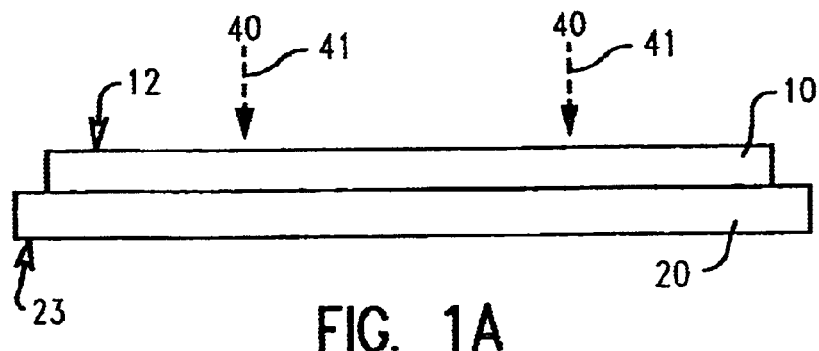
FIG. 1 is a cross sectional view of a greensheet having a full area support film thereon for preventing embossing and distortion of the greensheet during punching vias therein the greensheet.

In describing the preferred embodiment of the present invention, reference will be made herein to FIGS. 1–5E of the drawings in which like numerals refer to like features of the invention. Features of the invention are not necessarily shown to scale in the drawings.

The present invention provides a method of processing a greensheet by attaching a removable support film to at least one surface of the greensheet in order to strengthen the greensheet during the process of punching via holes therein. The invention may be used for greensheets that are thin, thick, large, composite and combinations thereof. The support film is preferably a peelable support film that conformally and at least covers regions on a surface of the greensheet where openings are to be formed. The method includes casting a greensheet on a polymer support film so as to completely cover a first surface of the greensheet, thereby adding strength thereto the greensheet. A frame is attached to the opposing surface of the greensheet.

In this manner, the invention provides for a greensheet that is sandwiched between a polymer full area support film on a first surface and a thin metal frame in non-active areas on a second opposite surface. This full area support film is a support film that at least covers the full area or region of the substrate to be processed for forming openings or vias therein. The greensheet is then punched from the support film side to form vias therein, whereby the polymer full area support provides added strength to the greensheet therein significantly reducing embossing and deformation of such greensheet. This, in turn, leads to improvements in radial error and reducing embossing of the greensheet.

After the greensheet is punched, the full area support film may then be removed from the surface of the greensheet with little or no impact on via locations as the metal frame continues to support the greensheet. The greensheet subsequently undergoes further processing steps of screening and patterning by applying a conductive paste into the via holes and along the surface of the greensheet, followed by drying the greensheet. During these subsequent processing steps, the frame attached to the second surface of the greensheet provides the radial error control as it will not allow the greensheet to shrink.

As will be understood in accordance with the foregoing description, the invention is not limited to punching vias in a greensheet. Any known substrate including a greensheet, mask layer, metal layer, organic layer, inorganic layer or composites thereof may be directly attached to the full area support film of the invention on at least one surface thereof. Openings including vias, lines, deep holes, channels and the like may then be punched into the full area support film side of the structure, through such full support film, through the substrate and then out of the substrate at a surface opposing the full area support film. In so doing, the full area support film adds strength, rigidity and durability to the substrate thereby preventing any damage to such substrate including, for example, distortion, embossing, bending, deformation, breaking, cracking and the like. The substrate may then be further processed in accordance with the required specifications.

For ease of understanding, the invention is directed to punching vias into a greensheet, preferably a thin or thick greensheet with a large surface area.

As shown in FIG. 1, a greensheet 10 is provided having a planar top (first) surface 12 and a planar bottom (second) surface 11. The greensheet 10 generally has a rectangular or square shape, and may be a thin or thick greensheet. In the preferred embodiment, the greensheet has a thickness of less than 6 mils, more preferably a thickness ranging from about 1 mil to about 6 mils. The greensheet 10 may comprise any known greensheet material including, but not limited to, alumina, glass ceramic, aluminum nitride, borosilicate glass, polymeric binders, polymers, metal, plastic, oxides of ceramics and glass frit and grit.

Attached thereto the greensheet 10 is the full area support film 20. This full area support film 20 may be attached to either the top or bottom surface of the greensheet 10. Preferably, it is attached to the bottom surface 11 of the greensheet 10. In so doing, the full area support film is preferably attached to the greensheet during the casting process by selecting a proper film material so as to completely cover the entire surface area, i.e., the entire width and length, of the greensheet.

A critical feature of this full area support film 20 is that it provides added strength to the greensheet, during the process of punching via holes therein the greensheet and also during subsequent handling processes. The full area support film 20 preferably has a thickness ranging from about 0.5 mils to about 6 mils and comprises any suitable material for proper bonding to the greensheets, when cast on. The material selected for the full area support film should also have the characteristics of being substantially rigid allowing ease of handling the cast structure, suitable for via punching, having proper shrinkage characteristics during subsequent down-stream processing, e.g., screening, drying, inspection and stacking, as well as being of a suitable material that has a sufficient peel strength for ease and efficiency of removal of the full area support film from the greensheet.

Preferably, the full area support film 20 comprises a material including, but not limited to, polyester, polyethylene, polyethylene naphthalate (PEN), coated paper, polypropylene, silicone and composites including any of the above materials. Alternatively, the support film 20 attached to greensheet 20 may include a thin layer of metal, polymer, ceramic, cellulosic (i.e. cellulosed based paper or wood product) or combinations thereof having sufficient rigidity to prevent embossing or distortion of the greensheet during the process of punching vias therein. This rigid full area support layer is secured to the entire surface area of the greensheet 10 using an adhesive, including silicone, and may be removed just prior to either the screening process or just prior to the stacking process by UV or thermal.

Figure 2:
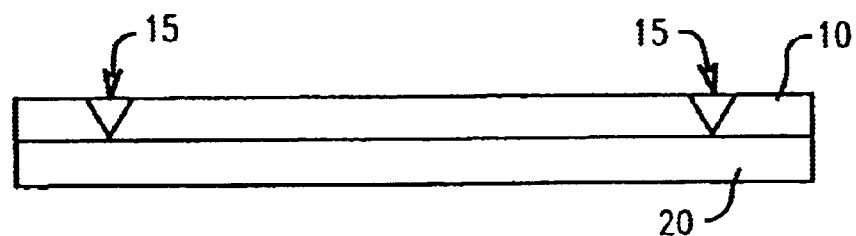
FIG. 2 is a cross sectional view of the greensheet and full area support film of FIG. 1 showing openings formed in the greensheet for the removal of the support film.

Referring to FIG. 2, in the preferred embodiment, the full area support film 20 is a peelable support film having the added feature of having a sufficient peel strength that enables the removal of the full area support film 20 without damaging the greensheet, the vias formed therein, as well as any metallurgy deposited within the vias. The full area support film 20 has a peel strength that correlates to the surface energy of the greensheet with respect to the full area support film.

Figure 1B:
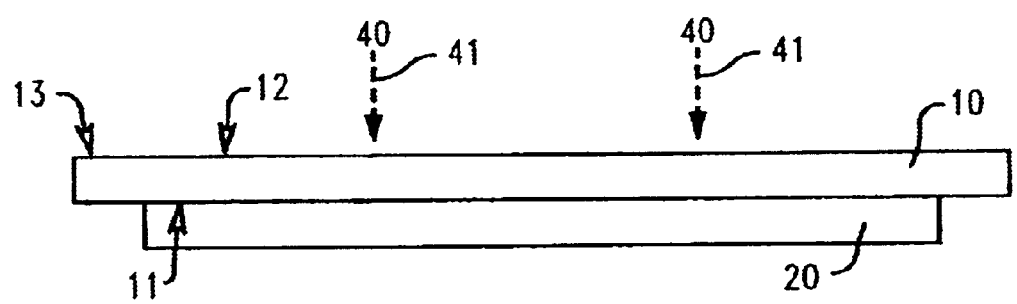

In accordance with the invention, the full support film 20 may be larger or smaller than the greensheet 10 it is attached to. In this manner, the full support film 20 extends beyond edges of the greensheet 10, as shown in FIG. 1A, therein having an extending lip portion 23. Alternatively, the greensheet 10 may extend beyond edges of the support film 20, as shown in FIG. 1B, therein the greensheet having an extending lip portion 13.

Figure 3A:
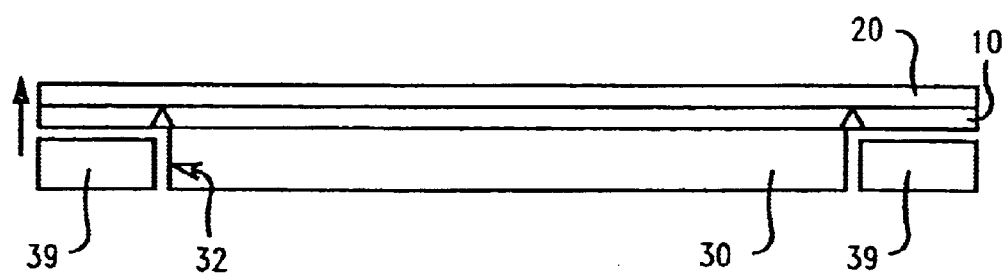
FIG. 3A is a cross sectional view of the greensheet and full area support film of FIG. 2 showing attachment of a vacuum to the openings in the greensheet.
Figure 3B:
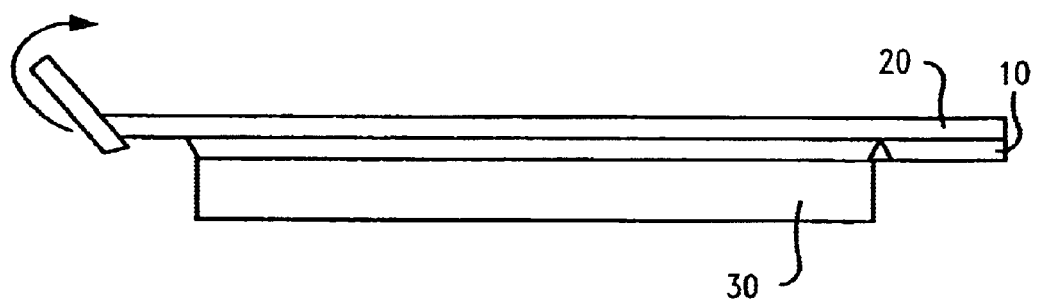
FIG. 3B is a cross sectional view of FIG. 3A showing removal of the full area support film from the greensheet, preferably by a split ring vacuum mechanism/tool to assist peeling back the full area support film.

In yet another embodiment, wherein the greensheet 10 and full support film 20 are of substantially the same size, the greensheet may be provided with a plurality of small cuts or openings 15 to provide the cast structure with weak joints at the edges of such structure, therein enabling the peeling of the support film from the greensheet as shown in FIGS. 2, 3A and 3B. These small openings may be made using laser, e-beam or mechanical techniques of any desired shape and size including, for example, rectangular, triangular, truncated triangular, and the like, and preferably include an angle sufficient for allowing removal of the support film from the greensheet. Preferably, small openings may be provided with angles of 90 degrees or less.

Referring to FIGS. 3A and 3B, during the removal, preferably peeling, of the full area support film from the greensheet, a vacuum may be adhered to the greensheet by suction as well as a holding means, preferably a split ring 39. Vacuum 30 and split ring 39 securely hold the greensheet during the process of removing the full area support film from such greensheet. The support film 20 is detached from the greensheet by peeling back the support film 20 in a direction preferably that is substantially parallel with the greensheet, as shown by the arrow in FIG. 3B. The greensheet having vias therein, as discussed further below, may then be screened and patterned.

Thus, in one embodiment of the invention, the greensheets may be individually processed without frames (i.e., punched and screened) and then stacked, with the frames being provided between selected pairs of the greensheets. The stacked greensheets and frames may then be laminated, and the frames subsequently cut away. Alternatively, the greensheet may be processed using frames as discussed below.

Figure 4A:
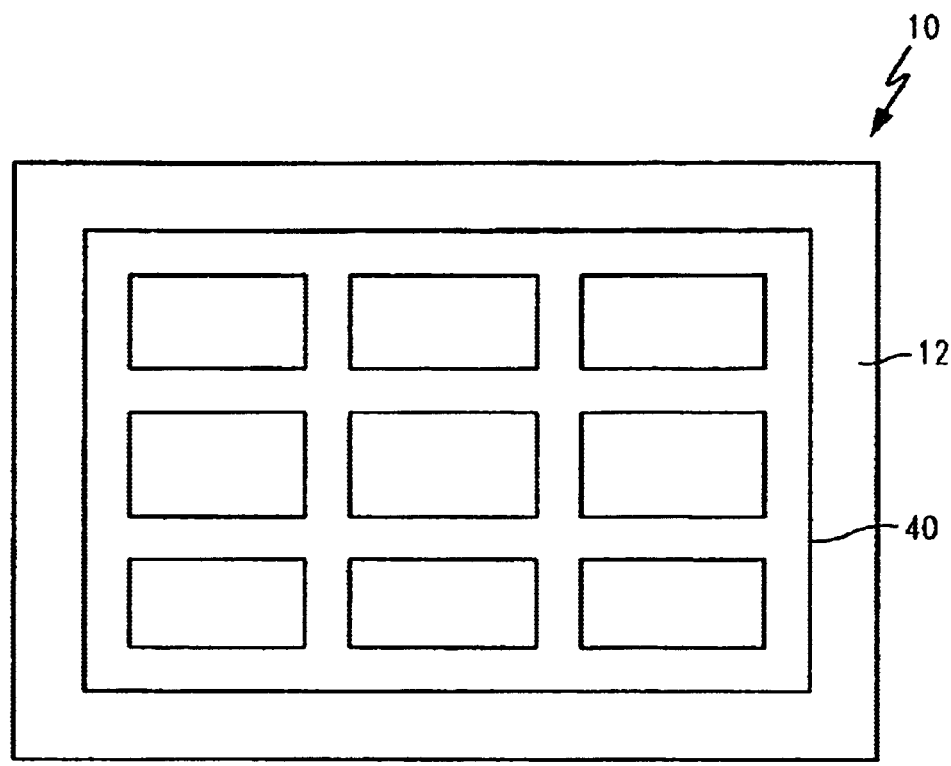
FIG. 4A is a top plan view of the greensheet of FIGS. 1–3B showing the greensheet having a frame attached to the greensheet surface opposing the support film.
Figure 4B:
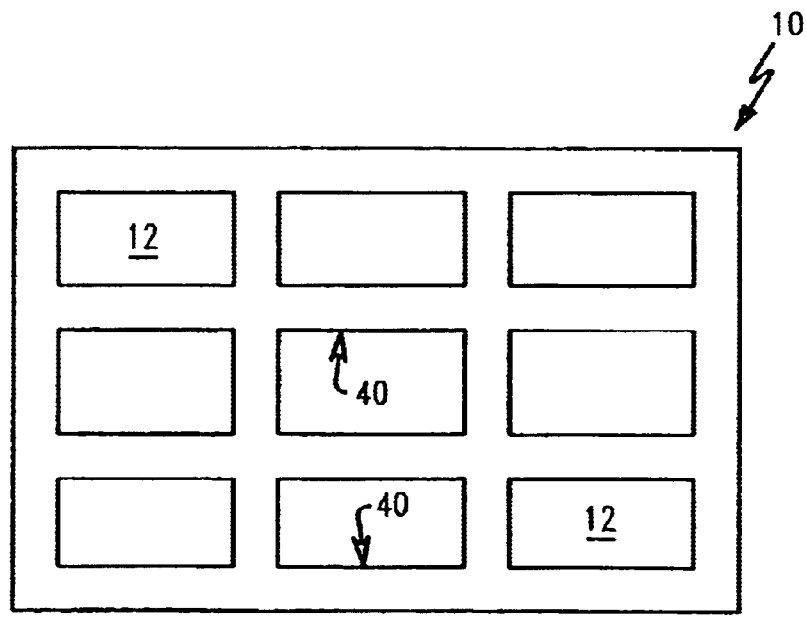
FIG. 4B is a top plan view of the greensheet of FIGS. 1–3B showing the greensheet having an alternate embodiment of a frame attached to the greensheet surface opposing the support film.

In addition to the full area support film 20 being attached to the bottom 11 of the thin greensheet 10, a frame 40 may be secured to the top surface 12 of greensheet 10, as shown in the top plan views of FIGS. 4A and 4B. This frame 40 is preferably a thin frame embedded into the top surface 12 of the greensheet 10 as referred to by the dashed arrows 41 in FIG. 1. Frame 40 may be attached to the top surface 12 of the greensheet by bonding or laminating the frame entirely within the greensheet width and length. Alternatively, the frame may have the exact dimensions as the width and length of the greensheet so that edges of the frame and greensheet mate with each other. That is, the frame constrains the greensheet at least around its outer edges.

Thus, in the present invention the greensheet 10 may be constrained by the support film on the bottom surface and constrained by the frame on the top surface prior to punching vias into the greensheet. In so doing, the support film prevents expansion and distortion of the greensheet during the punching process while the frame prevents shrinkage and distortion of the greensheet during a subsequent screening and drying process.

Frame 40 may include a grid of subframes, which, forms at least one active area, and preferably a plurality of active areas, within the greensheet, with each area completely bounded or surrounded by a frame member. The active areas may be of any desired size. It is preferably made from a unitary sheet of material including any material that is substantially resistant to movement, e.g., warping, shrinkage and the like, during subsequent processing of the greensheet and frame. These materials include, but are not limited to, a metal, polymer, ceramic, cellulosic (i.e. cellulose based paper or wood product), or composites thereof. For example, a nickel frame may be used for glass-ceramic or alumina-magnesia-silicate based ceramic greensheets, a molybdenum frame may be used for alumina greensheets, and a tungsten frame may be used for aluminum nitride greensheets. Preferred polymers include polyethylene naphthalate (PEN), polyester and polyethylene. Preferred ceramics include glass, including glass fibers, or other greensheet ceramic materials having higher strength than the greensheet on which the frame is applied.

In accordance with the invention, wherein a frame 40 is bonded to the top surface 12 of the greensheet 10, the frame may be bonded to the greensheet prior to attaching the full area support film 20 to the bottom surface 11 of the greensheet 10 and prior to punching the vias in the greensheet. Alternatively, the support film 20 may be attached to the greensheet prior to the frame 40. In both cases, the resultant structure is a greensheet sandwiched between frame 40 on the top surface of the greensheet and the support film 20 on the bottom surface of the greensheet. Vias and holes, preferably greater than 1 mil with pitch up to about 400 microns, may then be punched into the greensheet.

In so doing, an essential feature of the invention is that the vias and holes be punched into the greensheet by punching first into the support film, through the greensheet and out an opposing surface of the greensheet by techniques including, but not limited to, mechanical punching, laser punching, e-beam, photolithography and the like. That is, the punch enters the support film on the bottom surface of the greensheet, traverses through the support film and through the greensheet and then exits the greensheet at the top surface having the optional frame embedded therein. In so doing, the full area support film 20 of the invention provides added support to the greensheet, therein constraining movement of the greensheet during the via punching process to prevent damage to the greensheet including embossing or distortion of such greensheet, which in turn, leads to significant improvements in radial error.

As discussed above, the support film 20 may then be removed or peeled from the greensheet without damaging the greensheet or the vias and holes formed therein. After removal of the support film, wherein the greensheet has frame 40 attached to the top surface thereof prior to via punching, only frame 40 now constrains movement of the greensheet for the subsequent processing steps of screening and patterning the greensheet by applying a conductive paste, such as a copper or nickel based paste with or without glass grit and/or frit, into the via and holes and along the surface of the greensheet. Thus, in such embodiment, during the via and hole punching process the greensheet is constrained at both its top surface by the frame and at its bottom surface by the full area support film. In an alternate embodiment, only the support film may be attached to the greensheet during the via and hole punching process, and then the frame is subsequently attached to the greensheet for constraining the greensheet during the subsequent processing steps. During these subsequent processing steps, the frame attached to the second surface of the greensheet provides the radial error control as it constrains movement and will not allow the greensheet to shrink.

In the above embodiments of the invention, the support film is preferably removed after punching of the vias and holes therein the greensheet and then the greensheet undergoes further processing. Alternatively, as discussed below, the support film may remain attached to the greensheet during the subsequent processing steps.

FIGS. 5A–E illustrate the process steps of this alternate embodiment of processing greensheet 10. The bottom surface 11 of the cast greensheet 10 on the full area support film 20 and frame 40 may optionally be embedded into the top surface 12 of the greensheet. Vias and holes 50 are then punched through the support film, through the greensheet 10 and out the top surface 12 of the greensheet, as denoted by the arrows in FIG. 5B.

Once the plurality of vias 50 are punched into the greensheet, a critical aspect of this embodiment is that the support film 20 remains on the bottom surface of the greensheet. A second full area support film 70 may then be provided. This second full area support film 70 has a thickness ranging from about 0.5 mil to about 6.0 mils of the materials as discussed above.

At least one surface of the second full area support film 70 is then provided with a conformal interface layer 60 that has sufficient adherence or fastening strength that enables the secure attachment of the second full area support film 70 to the first full area support film 20. Preferably, the interface layer 60 is provided over the second support film 70 in an amount sufficient to at least fill openings 22 formed in the first support film 20 during the punching of vias 50 into the greensheet. This interface layer 60 is preferably a silicone-based material, such as polydimethyl sulfoxide, cured and/or partially cured silicone and the like. It enables screening of the greensheet with added support as well as removal of the interface layer from the deposited metallurgy without substantially damaging such metallurgy.

Figure 5A:
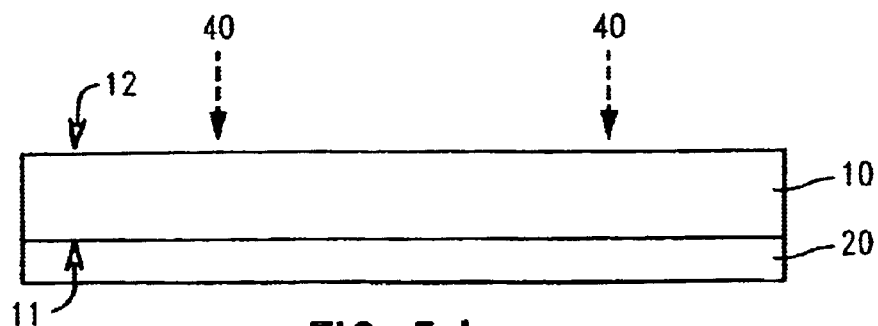
FIG. 5A is an alternate embodiment of the invention showing a cross sectional view of the greensheet having a first full area support film thereon.
Figure 5B:
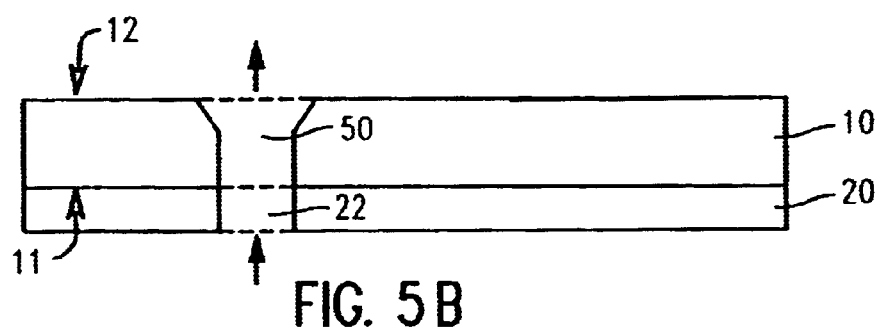
FIG. 5B is a cross sectional view of the greensheet and the first full area support film thereon of FIG. 5A showing the formation of vias by punching into the first support film through the greensheet.
Figure 5C:
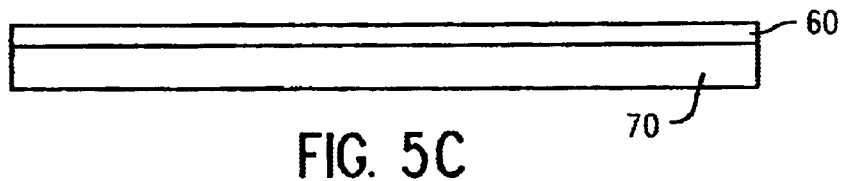
FIG. 5C is a cross sectional view of a coating material on a surface of a second full area support film.
Figure 5D:
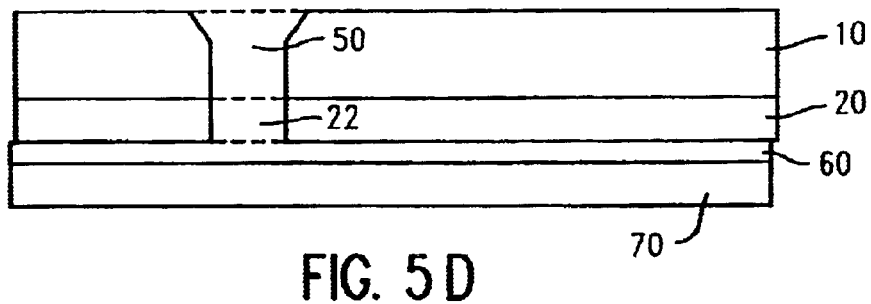
FIG. 5D is a cross sectional view of showing the coating material on the second support film of FIG. 5C attached to the bottom surface of the first support film, which is attached to the via punched greensheet.
Figure 5E:
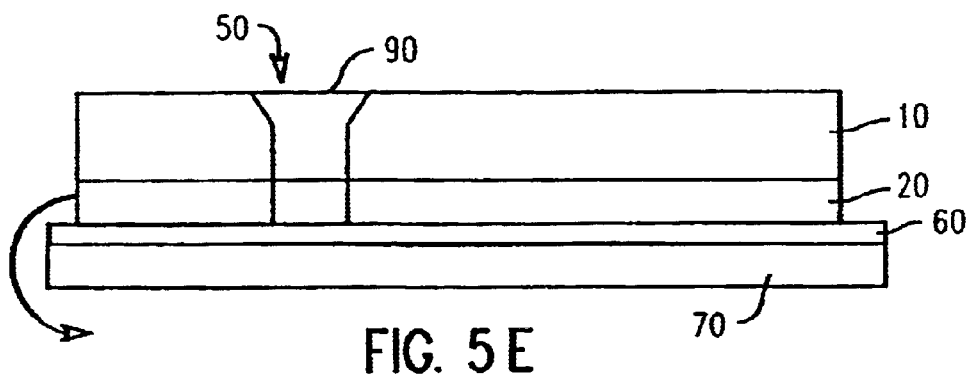
FIG. 5E is a cross sectional view illustrating the steps of screening the vias within the greensheet of FIG. 5D with a metal paste and subsequently removing first and second support films having therebetween the coating material without damaging the greensheet, vias or deposited metallurgy.

Referring to FIG. 5D, the second full area support film 70 is then secured to the first full area support film 20 via interface layer 60, such as by lamination. In securing these layers together, pressure may be applied to adhere these layers to each other as well as to extrude a sufficient amount of the interface layer 60 so as to fill openings 22 within the first support film as shown in FIG. 5E. Alternatively, this interface layer 60 material may be extruded to fill openings 22 during the process of screening a metal paste into the vias 50 to form conductive features 90. In so doing, a metal paste is screened into vias 50 from the top surface 12 of the greensheet at a substantially constant pressure while substantially the same pressure is applied to the support film 70 and interface layer 60 at the bottom portion of the greensheet so that the metal paste and the interface layer contact each other at the top surface of the first support film 20. In either method of extruding the interface layer into the openings 22, interface layer is preferably extruded into the support film 20 until it is substantially planar with the top surface of the support film which is attached to the greensheet 10. That is, the paste is screened preferably to the bottom of the via and/or holes therein the greensheet.

As shown in FIG. 5E, once the metal paste is screened into the vias to form conductive features 90, the first support film 20, interface layer 60 and second support film 70, which are all securely fastened to each other, may be simultaneously removed from the bottom surface 11 of the greensheet in a single step without damaging the greensheet, the vias formed therein or the deposited metallurgy. These support films 20, 70 and interface layer 60 layers are removed by peeling back as shown by the arrow in FIG. 5E.

Tests of greensheets processed in accordance with the present invention show significant decreases in damage to such greensheets as well as an improved reduction in maximum radial error.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A method of forming openings in a substrate comprising:
providing a substrate having a first surface and a second surface;
attaching a first removable support film to said first surface of said substrate;
forming at least one opening in said substrate by entering said first removable support film on said first surface, traversing through said substrate and exiting said substrate at said second surface; and
attaching a second removable support film to said first removable support film using an interface layer, whereby sufficient pressure is applied so as to extrude a portion of said interface layer into said at least one opening in said first removable support film,
wherein said first removable support film prevents damage to said substrate by constraining movement of said substrate during formation of said at least one opening.

2. The method of claim 1 further including attaching a frame to said second surface of said substrate, wherein after removal of said first removable support film, said frame constraining movement of said substrate during subsequent processing steps.

3. The method of claim 1 wherein said first and second removable support films are removed by removing said first and second removable support films in a direction substantially parallel to said substrate.

4. The method of claim 1 wherein said substrate is selected from the group consisting of a greensheet, mask layer, metal layer, organic layer, inorganic layer and composites thereof.

5. The method of claim 1 wherein said at least one opening is selected from the group consisting of a via, line, deep hole and channel.

6. The method of claim 1 wherein said first and second removable support films comprise, respectively, first and second peelable support films.

7. A method of processing greensheets for use as microelectronic substrates comprising:
providing a greensheet having a first surface and a second surface;
attaching a first removable support film to said first surface of said greensheet;
forming a plurality of openings in said greensheet by sequentially traversing through said first removable support film, through said greensheet and exiting said greensheet at said second surface;
depositing an interface layer on a second removable support film; and
attaching said second removable support film to said first removable support film using said interface layer, whereby sufficient pressure is applied so as to extrude a portion of said interface layer into said plurality of openings in said first removable support film,
wherein said first removable support film constrains movement of said greensheet to prevent damage thereto said greensheet during formation of said plurality of openings.

8. The method of claim 7 further including attaching a frame to said second surface of said greensheet, wherein after removal of said first and second removable support films, said frame constrains movement of said greensheet during subsequent processing steps.

9. The method of claim 7 wherein said greensheet comprises a material selected from the group consisting of alumina, glass ceramic, aluminum nitride, borosilicate glass, polymeric binders, polymers, metal, plastic, oxides of ceramics, glass frit and glass grit.

10. The method of claim 7 wherein said first and second removable support films each have a thickness ranging from about 0.5 mils to about 6 mils.

11. The method of claim 7 wherein said first and second removable support films each comprise a material that has sufficient rigidity to prevent damage to said greensheet during said processing steps.

12. The method of claim 11 wherein said material of said first and second removable support films are each selected from the group consisting of a metal, wood product, ceramic, polymer, polyester, polyethylene, polyethylene naphthalate, cellulosed based paper, polypropylene, silicone and composites thereof.

13. The method of claim 7 wherein said first removable support film is cast to said greensheet.

14. The method of claim 7 wherein said step of sequentially processing said first removable support film and said greensheet comprises punching a plurality of openings in said first removable support film and said greensheet using a punching tool that enters said first removable support film, traverses therethrough, enters said greensheet at said first surface, traverses through said greensheet and exits said greensheet at said second surface.

15. The method of claim 7 further including forming at least one angled opening in said greensheet to provide said first removable support film attached to said greensheet with at least one weak joint for removing said first support film from said greensheet.

16. The method of claim 7 wherein said first and second removable support films comprise, respectively, first and second peelable support films.

17. A method of processing greensheets for use as microelectronic substrates comprising:
providing a greensheet having a first surface and a second surface;
attaching a first peelable support film to said first surface of said greensheet;
forming a plurality of openings in said greensheet by sequentially traversing through said first peelable support film on said first surface, traversing through said greensheet and exiting said greensheet at said second surfaces;
depositing an interface layer on a second peelable support film; and
adhering said first and second peelable support films to each other using said interface layer whereby sufficient pressure is applied so as to extrude a portion of said interface layer into said plurality of openings at least in said first peelable support film,
wherein said first peelable support film has substantial rigidity to prevent damage to said greensheet by constraining movement of said substrate during formation of said plurality of openings.

18. The method of claim 17 wherein said plurality of openings are selected from the group consisting of a via, line, deep hole, channel and combinations thereof.

19. The method of claim 17 further including attaching a frame to said second surface of said greensheet.

20. The method of claim 17 wherein said second peelable support film comprises a material selected from the group consisting of a metal, wood product, ceramic, polymer, polyester, polyethylene, polyethylene naphthalate, cellulosed based paper, polypropylene, silicone and composites thereof.

21. The method of claim 17 further including the steps:
screening a metal paste over said second surface of said greensheet so as to fill said plurality of openings and form a plurality of conductive features within said greensheet; and
peeling said first peelable support film, said interface layer and said second peelable support film off of said greensheet in a direction that is substantially parallel with said first surface of the greensheet without damaging said greensheet and deposited metallurgy.

22. The method of claim 17 further including forming at least one angled opening in said greensheet to provide said first support film attached to said greensheet with at least one weak joint for peeling said first support film off of said greensheet.

* * * * *